(12) United States Patent
Lackey

(10) Patent No.: US 6,467,044 B1
(45) Date of Patent: Oct. 15, 2002

(54) ON-BOARD CLOCK-CONTROL TEMPLATES FOR TESTING INTEGRATED CIRCUITS

(75) Inventor: David E. Lackey, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/421,861

(22) Filed: Oct. 20, 1999

(51) Int. Cl.[7] .................................. G06F 1/08
(52) U.S. Cl. .................. 713/501; 713/400; 713/600
(58) Field of Search ........................ 713/1, 322, 400, 713/500, 600; 326/37, 39, 41; 714/731

(56) References Cited

U.S. PATENT DOCUMENTS

| | | | |
|---|---|---|---|
| 5,422,915 A | 6/1995 | Byers et al. | |
| 5,560,001 A | 9/1996 | Kardach et al. | |
| 5,602,878 A | 2/1997 | Cross | |
| 5,649,176 A | 7/1997 | Selvidge et al. | |
| 5,710,910 A | 1/1998 | Kehl et al. | |
| 6,301,671 B1 * | 10/2001 | Boice et al. ................. | 713/322 |
| 6,323,677 B1 * | 11/2001 | Lane et al. .................... | 326/37 |
| 6,327,684 B1 * | 12/2001 | Nadeau-Dostie et al. ... | 714/731 |
| 6,363,431 B1 * | 3/2002 | Hammer et al. ............ | 709/238 |

\* cited by examiner

Primary Examiner—Thomas Lee
Assistant Examiner—Thong-Thai Tien Nguyen
(74) Attorney, Agent, or Firm—Katten Muchin Zavis Rosenman

(57) ABSTRACT

An integrated circuit employing a built-in self testing is provided. The circuit comprises a clock controller, a plurality of logic domains, and a system clock. The clock controller includes a plurality of programmable clock templates. The logic domains operate based on clocks having different clocks and/or on different edges of the clocks and operable asynchronously with respect to the others of said logic domains. The system clock is distributed to the logic domains and to the clock controller. Herein, each logic domain generates master/slave signals in response to the received system clock and each of the clock templates distributes enabling signals to at least one corresponding logic domain. The enabling signals are for selectively gating the generated master/slave signals for distribution throughout at least one corresponding logic domain.

10 Claims, 5 Drawing Sheets

ON-BOARD CLOCK-CONTROL TEMPLATES FOR TESTING INTEGRATED CIRCUITS

FIELD OF THE INVENTION

The present invention relates to clock signal control for use in integrated circuits; and, more particularly, to a clocking mechanism that does not require added datapath logic or added skew management between clock domains and that provides launch and capture product clock capability for the testing of product logic designs having multiple operating frequencies and/or operation using multiple clock edges.

BACKGROUND OF THE INVENTION

Advances in integrated circuits have enhanced the ability to integrate increasingly more circuits on a single chip. As the circuit complexity on a chip increases, so does the need to thoroughly test the circuits. A general solution to the problem of testing integrated circuits is to embed test circuitry on the chip itself. One such methodology is commonly known as "Logic built-In Self test" (LBIST) and utilizes what is commonly referred to as "Self-Test Using Multiple Signal Registers and pseudo-Random Pattern Generators" (STUMP) architecture. LBIST circuits typically test a circuit's function and provide a failure indication if the circuit is not functioning properly.

Ideally, such testing systems should provide at least three functional modes which include: 1) an operational mode that allows the chip to perform in its intended manner, 2) a system test mode that allows for internal system-based testing; and 3) an external test mode that allows for external input of test data through the chip's pins.

As the number of circuits and logical functions integrated onto a single chip increases, the complexity and sophistication of on-chip LBIST circuits and desired LBIST performance features also increases. One problem that arises in such design relates to clock control when attempting to test the circuits at their operational speed. Specifically, known methods for clock control and LBIST-STUMP architecture lead to significant intrusion (e.g., delay, latency, duty cycle alteration) of the system clock signal and either require system data path reduction for at-speed scan operation or multiple system clock trees with critical balancing of the timing between the trees.

Edge-triggered design having STUMPs based LBIST capability require a clock control structure for switching between system operational mode and test mode, and for performing a master and slave operation in one system cycle. Such systems require that data be launched from the slave to the combinational logic to be tested, and to capture the result in the master of the next stage Known methods for achieving such control use logic manipulation of the oscillator signal prior to the clock powering logic. Such systems either use edge-triggered flip-flop with scan multiplexing to manipulate oscillator edges for launch and capture control, or convert the system clock signal into a master and slave clock and separately enable these two clocks for system LBIST test or scan operation. These techniques, however, have significant disadvantages.

Edge-triggered flip-flop clock systems using a straight forward application of edge-triggered design methods present significant intrusion on the oscillator wave form. U.S. Pat. No. 4,961,013 issued to Obermyer, Jr. et al. "Apparatus for Generation for Scan Control Signals for Initialization and Diagnosis of Circuitry in a Computer," discloses such a system. Such systems typically utilize OR and XOR gates, adding delay-latency and potential duty cycle alteration due to any rise/fall time imbalance. Furthermore, at-speed scan operation requires system data path reduction caused by data port multiplexer delay.

Additional Background

Some systems are designed using multiple clocks, whereby the set of latches or flip-flops receiving a particular clock can be called a clock domain, thus the system has multiple clock domains. Testing of such systems has to deal with the issue of reliably testing the paths between the domains, particularly when the domains' clocks do not operate synchronously with each other. Known methods requiring either 1. the addition of data path logic, at the cost of circuit area, logic design complexity, and performance impact, for the purpose of synchronizing these paths during test operation, or
2. Blocking these paths during the test operation, resulting In the loss of testing coverage and, like 1., adding circuit area, complexity and impacting performance.

Although various patents have attempted to address some of these issues, none provide an efficient means of overcoming the above-identified problems.

Therefore, there is a need for simplified clocking mechanism that provides launch and capture product capability for the testing of product logic, for designs having multiple operating frequencies and/or multiple operation clock edges, that does not require added datapath logic or added skew management between clock domains. All of the above references are incorporated herein by reference.

SUMMARY OF THE INVENTION

It is, therefore, a primary object of the present invention to provide a generic clocking mechanism that can be applied to any clock-based logic design.

In accordance with the present invention, there is provided an integrated circuit comprising: a clock controller including a plurality of programmable clock templates; a plurality of logic domains, each operating based on clocks having different clocks and/or on different edge of the clocks and operable asynchronously with respect to the others of said logic domains; and a system clock distributed to the logic domains and to the clock controller, each logic domain generating master/slave signals in response to the received system clock, each of the clock templates distributing gating signals to at least one corresponding logic domain, the gating signals selectively gating the generated master/slave signals for distribution throughout said at least one corresponding logic domain.

BRIEF DESCRIPTION OF THE DRAWINGS

The above and other objects and features of the present invention will become apparent from the following description of preferred embodiments given with reference to the accompanying drawings.

DETAILED DESCRIPTION OF THE PREFERRED EMBODIMENTS

Integrated circuits, especially, digital sequential circuits comprising flip-flop based logic, are dependent upon clocks. The design of such digital sequential circuits involves the description of the product as one or more clock domains. Certain logic units employed in the integrated circuits may operate based on distinct clocks. The clock domain can be defined as a set of flip-flops that all receive the same common clock. The clocks on which they operate can be categorized into the following clock domains.

One or more domains are clocked at a maximum frequency X, which are defined as "domain 1." Here, flip-flops employed in the integrated circuits transition on the rising edge of the clock, and, therefore, this domain is "clocked on the rising edge of X." Optionally certain domains are clocked using the inversion of clock X, which are defined as "domain 2." This domain is "clocked on the falling edge of X". Further, certain domains are clocked at a frequency Y, a frequency less than X, which are defined as "domain 3." This less frequency may be derived from X by using clock divider logic (clocks X/2, X/4, etc) or other similar means, or may optionally be unrelated to clock X (clock Y, where frequency Y<frequency X. Finally, another domain may be defined as "domain 4." This domain is clocked by various clock signals in a highly interspersed fashion. In this domain, such a collection of logic may be clocked by many clocks, may use various edges of the same clocks for different sets of flip-flops, may be fully asynchronous, or may be based upon transparent latch design techniques, e.g., multiple phase level sensitive design.

Figure 1:
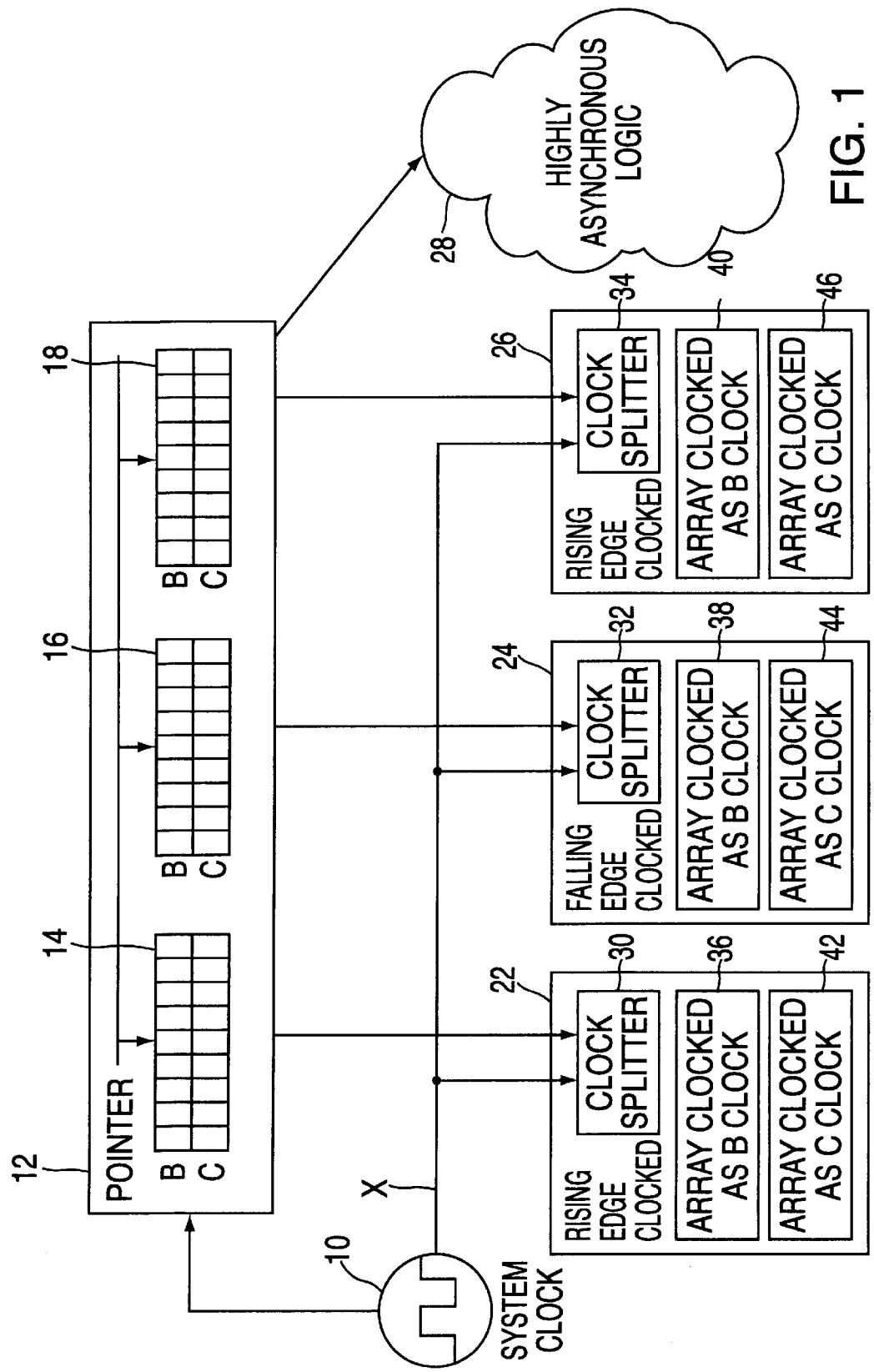
FIG. 1 is a clocking mechanism in accordance with the present invention.

Referring now to FIG. 1, there is shown a clocking mechanism in accordance with the present invention. An oscillator is given with reference number 10, which generates a system clock of frequency X. The system clock is fed to clock templates 12 and various clock domains 22–26. The clock templates 12 are designed for use in a test controller. The responsibility of this templates is to produce a B signal and a C signal at an appropriate time. The clock templates 12 control all clock domains in an on-product test operation through a separate and programmable control of all launch and capture clocks. These clock templates include pairs 14–18 of registers B and C, each pair associated with each clock domain. The registers can be programmable in conformity with the desired test operation of each clock domain. The B and C signals are generated by each registers 14–18 to produce a control that enables the receiving domain to receive its system clock. In other words, the B and C signals allow the latches to receive their value. In sequencing through the clock templates 12, a common pointer is used for each register pair 14–18.

Domains of type 1, 2 and 3 above are based upon a mechanism of distributing a single clock that transitions the flip-flops within the domains on the appropriate edge. The flip-flops are created by two latches, a master latch and a slave latch. The output of the master latch is the data input to the slave latch. The clock to the master latch is the inversion of the clock X and the clock to the slave is the positive version of X. These latches update their value when that clock signal is high. For the purpose of illustration, it is assumed that the master latch updates its value when the clock incoming thereto goes low and the slave latch updates its value when the clock incoming thereto goes high. For the case of rising edge flip-flops, the master latch is transparent on the low level of clock, and the slave is transparent on the high level of clock. The opposite is the case for the falling edge flip-flops.

A master clock is a negative clock while a slave clock is a positive clock. In other words, for example, the former corresponds to the clock X and the latter corresponds to the inverse of the clock X.

As set forth in the above, each domain operates based on distinct clocks. Clock domains are shown with reference numbers 22–28. Domain type 1 22 of the domains operates based on the maximum frequency X of the system clock and on the rising edge of the clock. Domain type 2 24 operates based on the inverse of the maximum frequency X of the system clock and on the falling edge of the clock. Domain type 3 26 is operated based on a frequency Y, a fraction of the maximum frequency X, for example, X/2, X/4, etc., of the system clock and on the rising edge of the clock. Domain type 4 28 represents a highly asynchronous logic.

Within each domain 22–28, there is employed a clock splitter 30–34, a logic array clocked as a B clock 36–40 and as a C clock 42–46. Each of the clock splitters 30–34 generates an inverted signal and a non-inverted signal; the former is sent to each of the masters and the latter is sent to each of the slaves. The master clock and the slave clock can be gated within a "clock splitter" that is local to a latch-pair cell, embedded within the latch-pair cell, or shared among latch-pair cells for reduced circuit area and wiring congestion. Each clock splitter allows a signal B to gate the slave clock and a signal C to gate the master clock in a test mode. In normal system operations, the B signal and the C signal will be high, which allows the clock to propagate where the slave clock receives system clock and the master clock receives its inversion. The control of the B signal and the C signal allows the system clocks through at the appropriate times. Having this kind of control over the flip-flops with the B and C signals allows an "at-speed" test, i.e., the test of the flip-flops and their surrounding logic with the B and C signals at the intended speed under the control of X.

Domain type 4 28 must be able to be controlled by a direct use of master and slave inputs. Alternatively, this can also be accomplished using the clock splitter, in LSSD Mode.

Figure 3:
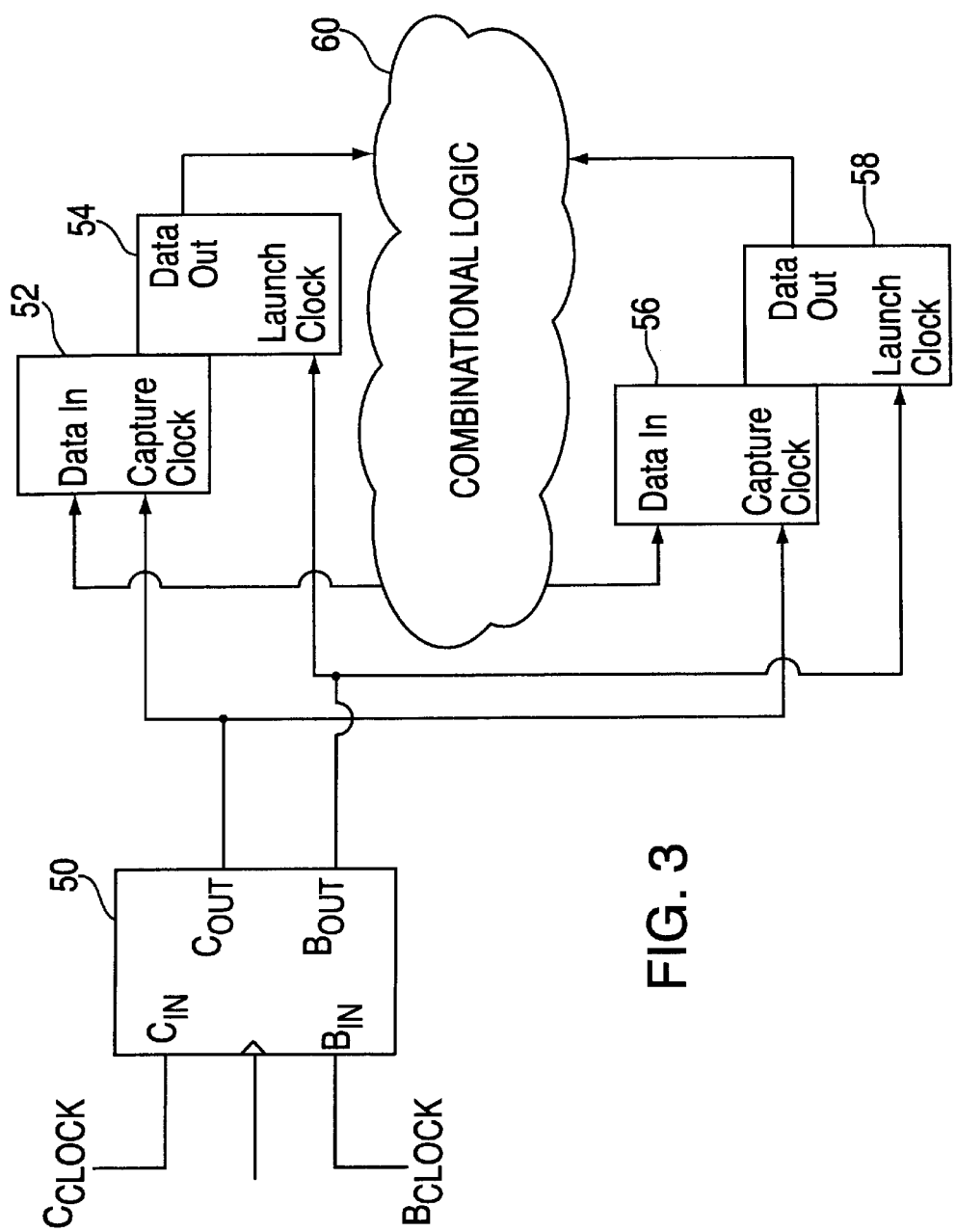
FIG. 3 describes a clock splitter and the master and slave latches.

Turning now to FIG. 3, which describes the clock splitter 50 and the master and slave latches 52–58, the clock splitter 50 receives the B and C enable signals from the templates 12 and the system clock from the oscillator 10. Upon receiving these signals and clock, the clock splitter 50 produces two signals, i.e., $B_{out}$ and $C_{out}$ which will in turn be applied to the latches 52–58. The $B_{out}$ signal is fed commonly to the master latches 52, 56 as a capture clock and the $C_{out}$ signal is fed commonly to the slave latches 54, 58 as a launch clock. Data from a combinational logic 60 is applied to "data in" terminal of the master latches 52, 56. Each of the slave latches 54, 58 generates "data out" signal and return it to the combinational logic 60.

Figure 4:
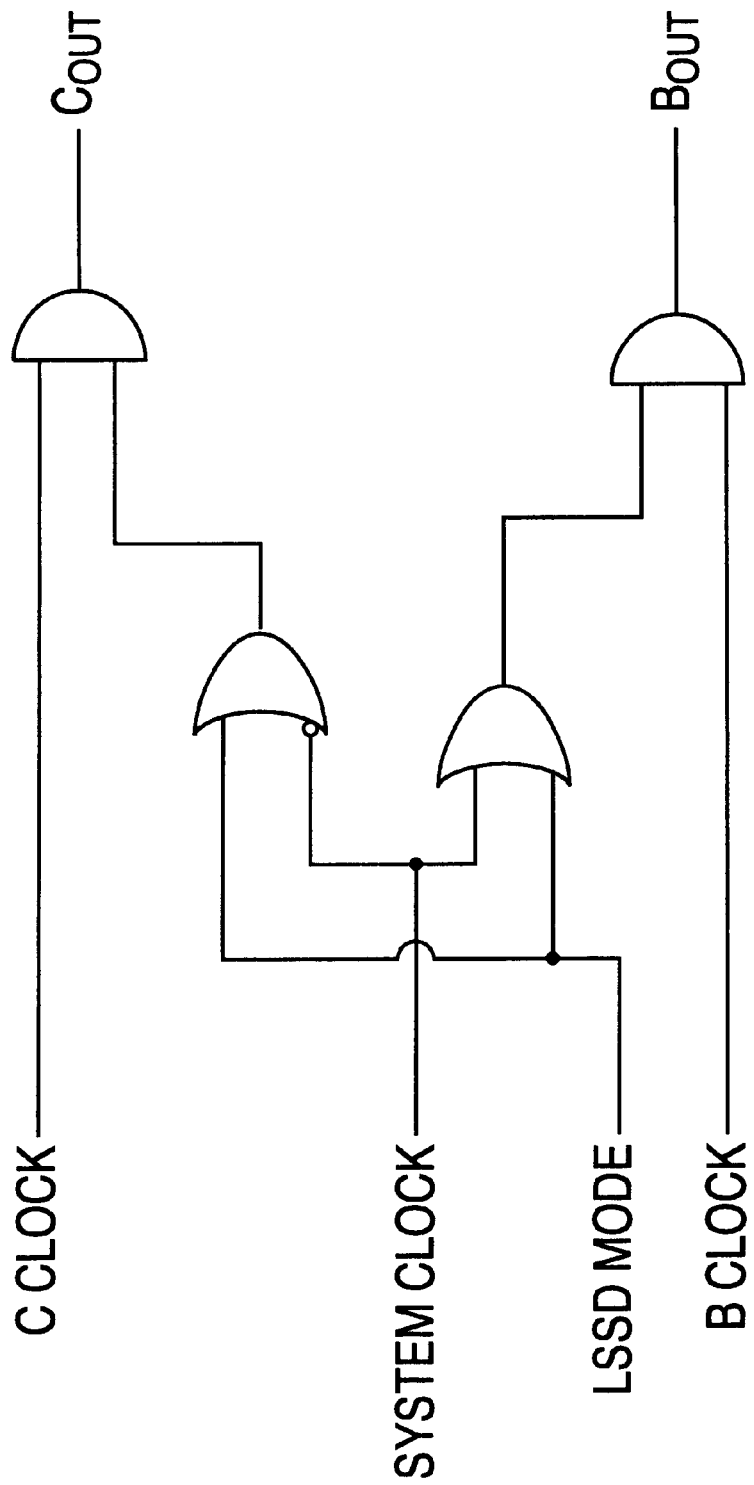
FIGS. 4 and 5 describe inner logic structure of the clock splitter in accordance with one embodiment of the invention and an alternative embodiment thereof, respectively.
Figure 5:
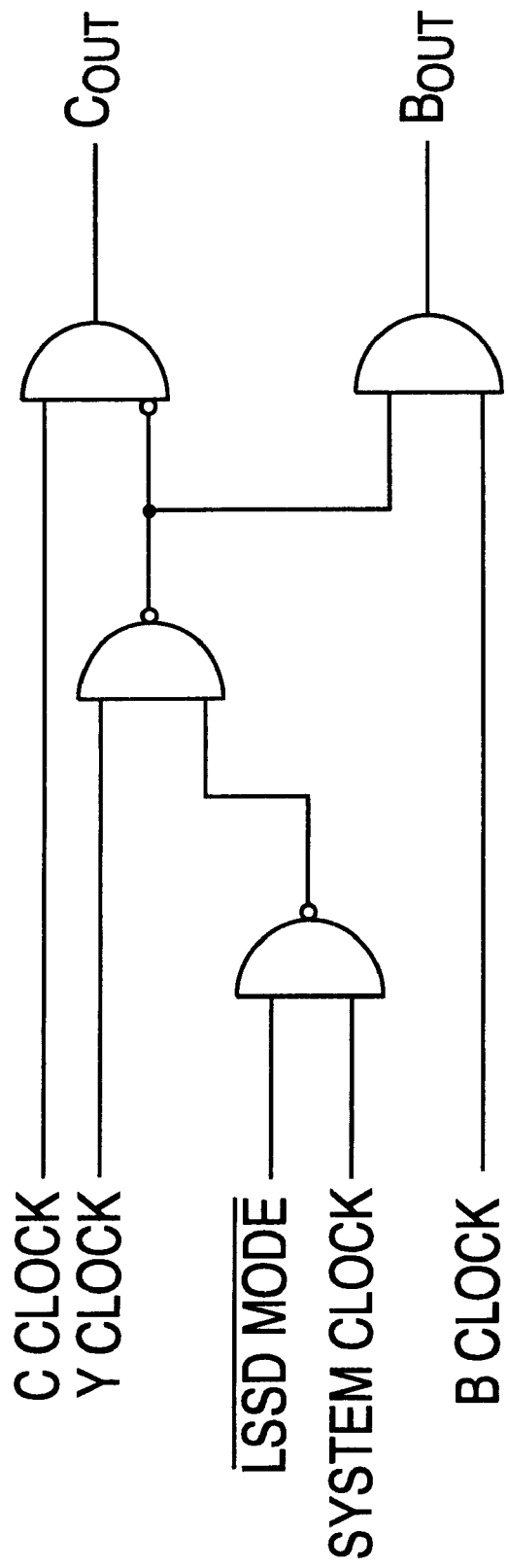

Inner logic structure of the clock splitter 50 are shown in FIG. 4 and the alternative embodiment thereof is shown in FIG. 5. A person skilled in the art will easily understand the operation of the logic structures provided in FIG. 4 and FIG. 5. In these structures, among other things, an "LSSD (level sensitive scan devices) mode" signal is used for transferring data to a scan chain comprising a plurality of master-slave latches 52–58.

Now, the operation of the inventive mechanism will now be described.

For the test operation under which the clock templates will be activated, the clock X is provided to all clock domains as shown in FIG. 1. For domains of type 1 or 2, the normal clock X or the inverted clock thereof is used for the test operation as well. For domains of type 3, a MUX is used to select a clock X for the test operation instead of the normal system clock.

A clock template consists of a pair of registers B and C, the former for slave clock and the latter for master clock. Each register consists of n bits and represents n cycles of operation at the frequency X. There is a B-C register pair for each clock domain. All registers represent a concurrent n cycles of operation at the frequency X, even for those domains that do not normally operate using X. When a bit is on in a B register, this signifies that in the corresponding cycle of X, a B signal will be sent to the corresponding clock domain. Likewise, when a bit is on in a C register, this signifies that in the corresponding cycle of X, a C signal will be sent to the corresponding clock domain.

In the case of domains of type 1, 2 and 3, the B and C signals are used as enables for the slave, master clocks by the clock splitter 30–34. In these cases, clock X for domain type 1, or inverted clock thereof for domain type 2, propagates to the corresponding domains, but is gated at the appropriate time set by the B and C enable signals, which results in a slave and master clock to the target flip-flops in the desired cycle as defined by the template. Using this mechanism, the test operation using a full-speed clock, such as for domain types 1 and 2, can be modeled by high bits in the same bit position M of each of the B and C templates for type 1 and 2 domains, respectively. This allows one cycle of full speed clocking.

For the domain of type 3, a reduced speed clock, but still based on the clock X, is required. Test operation using, e.g., ½ speed clocking is accomplished by issuing a B block as in the full-speed case, i.e., bit position M in the B register, but issuing the C clock a cycle later (Bit position M+1 in the C register). Likewise, for a ⅓ speed clock test operation, the test operation uses C register bit position M+2, and for ¼ speed it uses M+3, etc.

In this way, all clocking of domains of types 1, 2 and 3 are accomplished based upon the single clock X during the test operation. Clocking for those domains that must operate at a reduced frequency such as type 3 is accomplished by an appropriate programming of its corresponding clock template. The clock template can be used to create multiple-cycle sequences simply by turning on multiple bits in the appropriate registers.

Meanwhile, interfaces between domains are also exercised in the test operation. A path from a domain of type 1, for example, co a domain of type 3 is tested as a 2-cycle sequence, which results in reliable operation if the domain of type 3 can operate at a frequency that supports at least one-half the frequency of X. Whereas a path in the reverse direction is tested at full speed of X by the domain of type 1 that is receiving the path.

For domains of type 4, a test operation control of the clock splitter is enabled. Also, a "LSSD mode" signal that accompanies each B-C register pair is set for a domain of type 4. One mode bit corresponds to one domain. In this case, the B and C signals produced by template operation are treated as slave and master clocks directly, instead of being used as clock enables as in types 1, 2 and 3.

Figure 2:
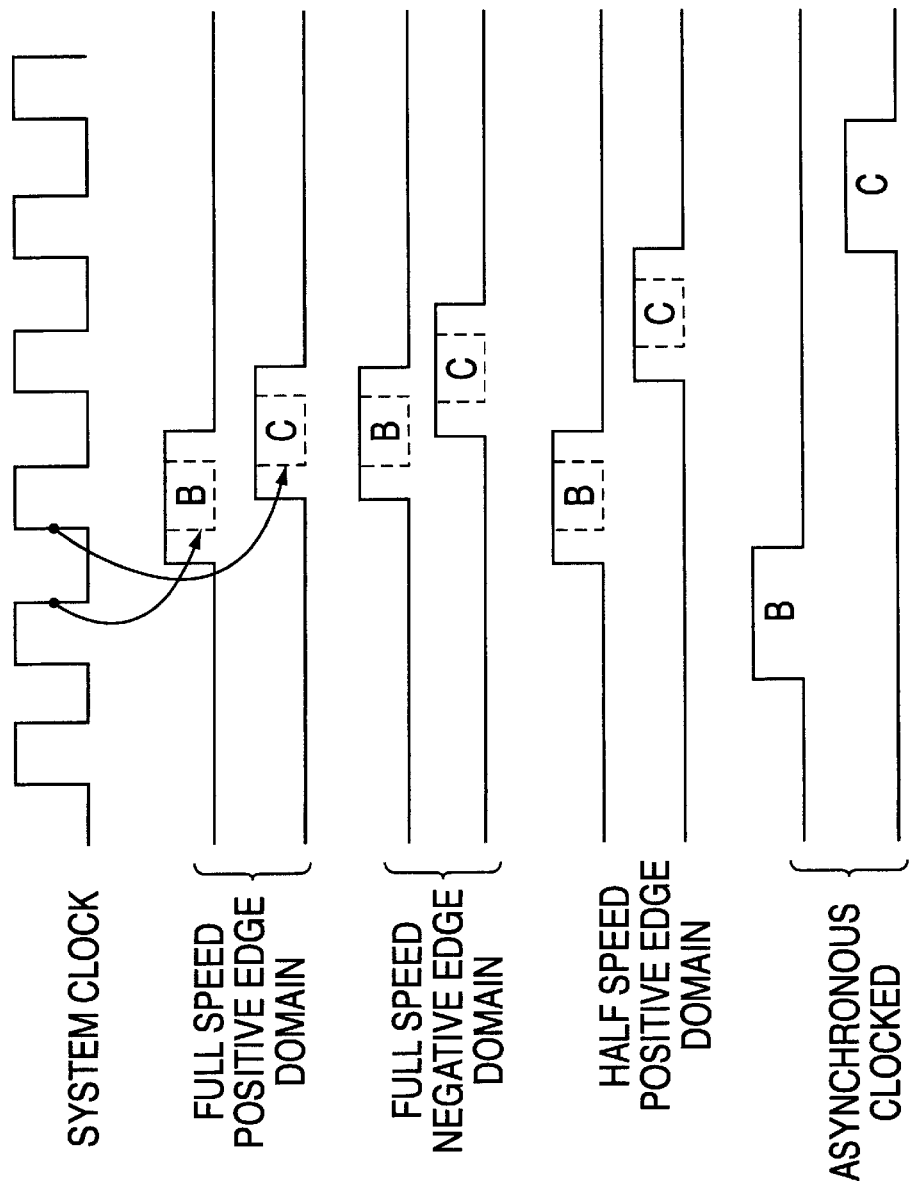
FIG. 2 illustrates timing diagrams of B and C derived from a system clock.

More description of B and C signals from the templates will now be given in parallel with FIG. 2.

When the templates 12 is not set in LSSD mode, the B and C signals are used as clock enables. There are two sets of the B and C signals for each domain. The first set is used for rising edge domains and the second set is used for falling edge domains.

As for the rising edge domain, the B signal from the template is triggered by the falling edge of X in order to function as an enable for the slave clock which is in phase with X. The C signal is triggered by the rising edge of X in order to function as an enable for the master clock which is the inverse of X. As for the falling edge domain, the B signal from the template is triggered by the rising edge of X in order to function as an enable for the slave clock which is the inverse of X. The C signal is triggered by the falling edge of X in order to function as an enable for the master clock which is in phase with X.

For B and C templates with high bits in position M, for the case of rising edge clocking, this corresponds to a B signal that turns on at the rising edge of X in cycle M-1 followed by a C signal that turns on at the subsequent falling edge of X. The result is a B clock, Bout, followed by a C clock, Colt, in cycle M. Clocks and signals associated with this mode are illustrated in FIG. 2.

When the template is set in "LSSD Mode", the B and C signals are used themselves as clocks. A B register bit set high in position J creates a B signal, and thus a slave clock, in cycle J. Likewise a C-register bit set high in position K creates a C signal, and thus a master clock, in cycle K.

As can be seen from the above description, the present invention employs the programmable clock templates, based upon a single clock source, that control all the clock domains in the test operation through separate and programmable control of all launch and capture clocks. This eliminates the need for skew management between the clock domains, allowing interfaces between the domains of differing frequency, and multiple-cycle paths, to be tested without clock path intrusion. This is a generic control method that can be applied to any clock-based logic design.

While the present invention has been described with respect to certain preferred embodiments only, other modifications and variations may be made without departing from the spirit and scope of the present invention as set forth in the following claims.

What is claimed is:

1. An integrated circuit comprising:
    a clock controller including a plurality of programmable clock templates;
    a plurality of logic domains, each operable asynchronously with respect to the others of said logic domains; and
    a system clock distributed to the logic domains and to the clock controller, each logic domain generating master/slave signals in response to the received system clock, each of the clock templates distributing enabling signals to at least one corresponding logic domain, the enabling signals selectively gating the generated master/slave signals for distribution throughout said at least one corresponding logic domain.

2. The integrated circuit of claim 1, wherein each of the clock templates includes a pair of registers for storing program data, the program data being used for generating clocks for each clock domain.

3. The integrated circuit of claim 2, wherein each register employed in each of the clock templates generates B and C signals to produce a control that enables the receiving domain to receive its system clock.

4. The integrated circuit of claim 3, wherein the number of the clock templates is identical to the number of the clock domains employed in the integrated circuit.

5. The integrated circuit of claim 1, wherein each of the clock templates distributes each of the enabling signals to at least one corresponding logic domain, the enabling signals for selectively gating the generated master/slave signals for distribution throughout said at least one corresponding logic domain.

6. The integrated circuit of claim 1, wherein the clock domains are categorized into four domain types: type 1 being clocked on a full-speed positive edge; type 2 being locked on a full-speed negative edge; type 3 being clocked on a less-than-full-speed positive or negative edge; and type 4 being clocked by various clocks in a highly interspersed manner.

7. A clock control method for test of an integrated circuit having a plurality of clock domains, comprising the steps of:
 (a) programming clock templates by setting bits therein in conformity with the clocks required for each clock domain;
 (b) generating a system clock, the system clock being distributed to the clock templates and each of the clock domains;
 (c) generating a B-enable signal and a C-enable signal at the clock templates according to the programmed bits;
 (d) sending the B-enable signal and the C-enable signal to each clock domain;
 (e) generating a $B_{out}$ and a $C_{out}$ signal by using the B-enable signal and the C-enable signal; and
 (f) feeding each of the $B_{out}$ and the $C_{out}$ clock to arrays or simple latches clocked as B clock and C clock, respectively.

8. The clock control method of claim 7, wherein the step (e) uses a LSSD (level sensitive scan design) mode signal in addition to the B-enable signal and the C-enable signal.

9. The clock control method of claim 8, wherein the clock domains are categorized into four domain types: type 1 being clocked on a full-speed positive edge; type 2 being locked on a full-speed negative edge; type 3 being clocked on a less-than-full-speed positive or negative edge; and type 4 being clocked by various clocks in a highly interspersed manner.

10. The clock control method of claim 9, wherein, in an LSSD mode, the B signal and the C signal are themselves used as slave and master clocks, respectively.

* * * * *